United States Patent [19]

Redfern

[11] 4,253,033
[45] Feb. 24, 1981

[54] WIDE BANDWIDTH CMOS CLASS A AMPLIFIER

[75] Inventor: Thomas P. Redfern, San Jose, Calif.

[73] Assignee: National Semiconductor Corporation, Santa Clara, Calif.

[21] Appl. No.: 34,063

[22] Filed: Apr. 27, 1979

[51] Int. Cl.³ .................. H03K 19/08; H03F 3/04; H03F 3/393
[52] U.S. Cl. .................. 307/205; 307/214; 330/9; 330/296; 330/300; 330/307
[58] Field of Search .............. 330/9, 10, 277, 296, 330/300, 264; 307/205, 214

[56] References Cited

U.S. PATENT DOCUMENTS

| | | | |
|---|---|---|---|
| 3,638,129 | 1/1972 | Pryor | 330/277 X |
| 3,739,193 | 6/1973 | Pryor | 307/214 X |

*Primary Examiner*—James B. Mullins
*Attorney, Agent, or Firm*—Gail W. Woodward; James A. Sheridan

[57] ABSTRACT

A CMOS inverter is coupled to drive a bipolar transistor emitter follower which has a field effect transistor load. The load transistor is provided with a d-c bias that causes the circuit to function as a class A amplifier. The amplifier has a gain-band-width product that is much higher than can be achieved with CMOS inverters alone and such amplifiers can be cascaded to achieve extremely high gain values. It is preferred to obtain the required class A bias from a similar circuit wherein the load transistor is replaced by a resistor and the emitter follower has its output directly coupled to the CMOS inverter input. This means that the voltage across the resistor is that value that will operate the bias circuit at its trip point independent of the manufacturing variables that affect transistor threshold values. This amplifier configuration is useful in constructing high-speed, high-sensitivity clocked comparators and clocked latches.

9 Claims, 6 Drawing Figures

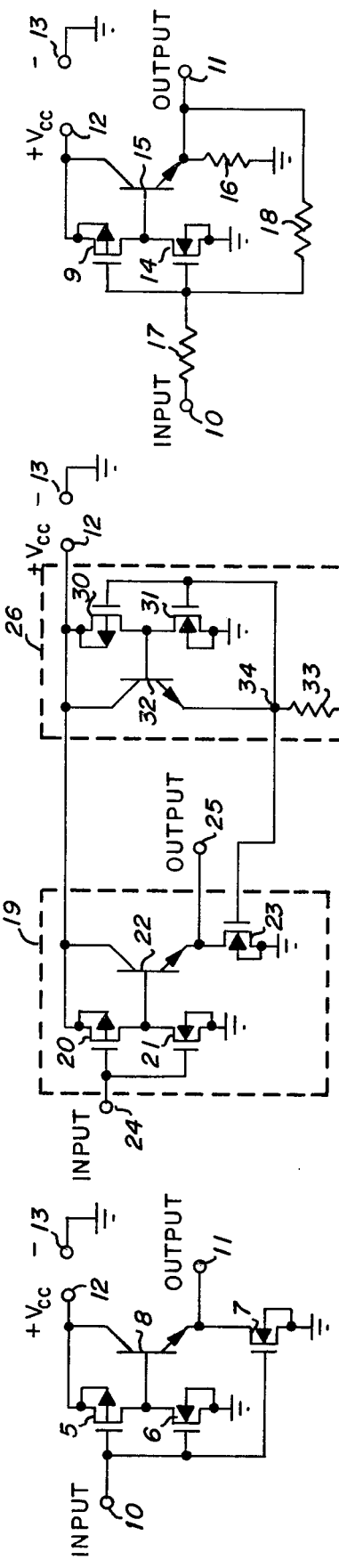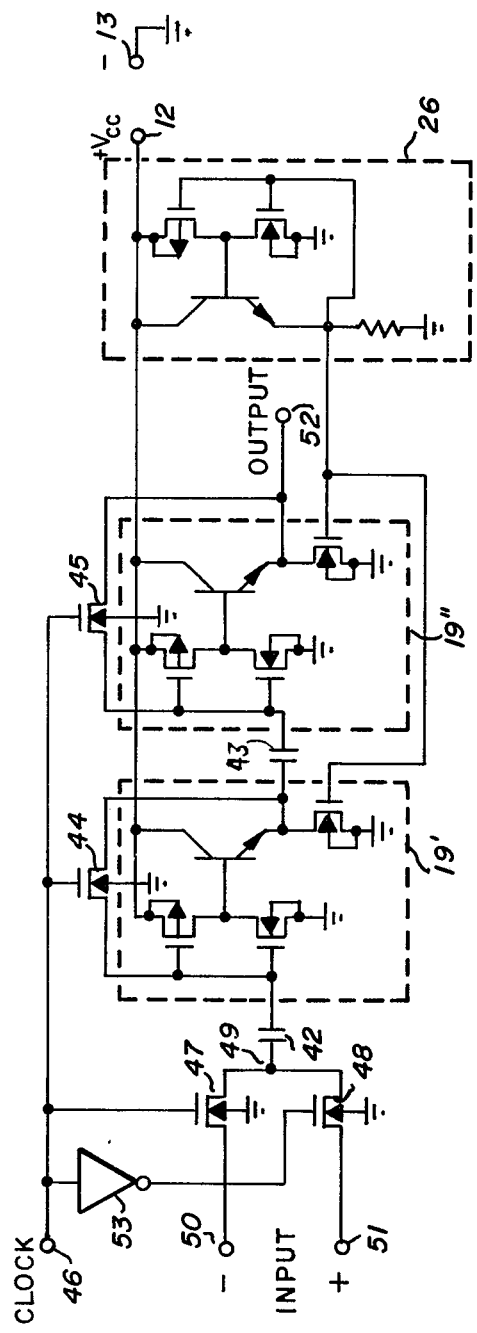

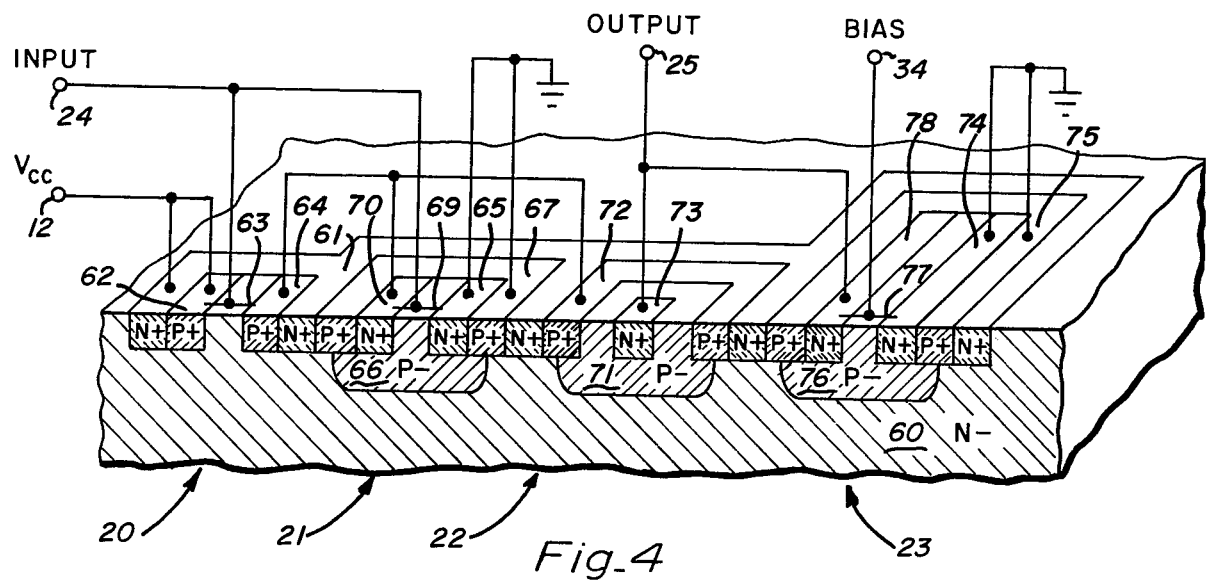
Fig_4
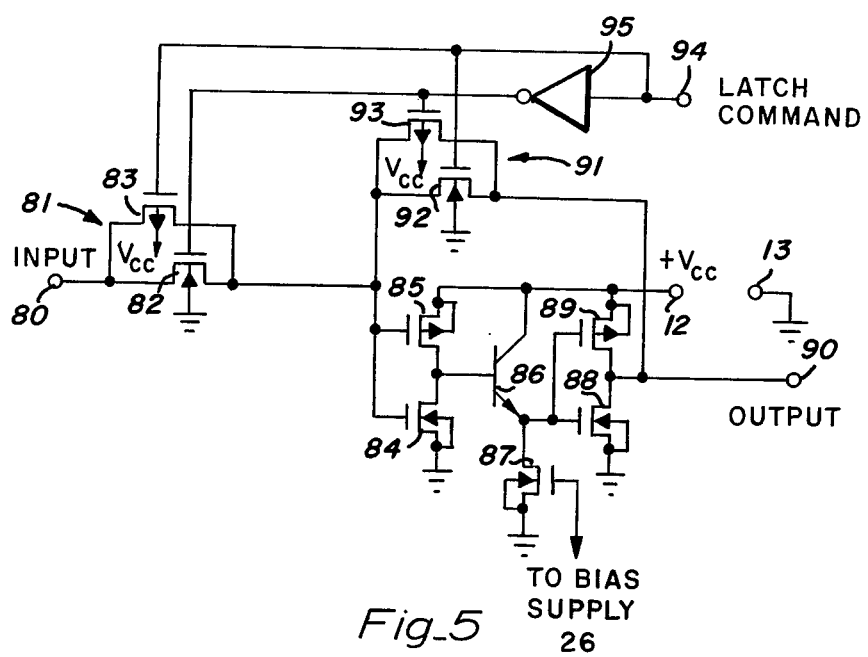
Fig_5

WIDE BANDWIDTH CMOS CLASS A AMPLIFIER

BACKGROUND OF THE INVENTION

The invention relates to complementary metal oxide semiconductor (CMOS) technology and its application to large scale integration (LSI). In general CMOS relates to the combination of an N channel transistor with a P channel transistor to create a basic inverter gate. In digital applications only one of these devices will be on at a time, except during the transitions between logic states. Thus, only switching related current flows and power dissipation is very low. The basic inverter gate can be combined with other gates to create the conventional logic functions.

While it is not often done, the inverter gate can be employed as a linear amplifier. If the P and N channel devices are ratioed so that the gate transition occurs at about $V_{CC}/2$, the gate will display substantial gain when biased at $V_{CC}/2$ and will have a linear input-output characteristic over a reasonably large range. However, the difficulty of biasing such amplifiers has substantially reduced their utilization.

BRIEF DESCRIPTION OF THE DRAWING

FIG. 1a is a schematic diagram of an amplifier used in the prior art as an inverter gate in digital devices.

FIG. 1b is a schematic diagram of a prior art linear amplifier using CMOS devices.

FIG. 2 is a schematic diagram of the amplifier of the invention.

FIG. 3 is a schematic diagram of a clocked comparator d-c amplifier using the amplifier of the invention.

FIG. 4 is a partial front elevation and cross section of an integrated circuit form of the amplifier in block 19 of FIG. 2.

FIG. 5 is a schematic diagram of a clocked latch using the amplifier of the invention.

DESCRIPTION OF THE PRIOR ART

It is not new to simply combine bipolar transistors in CMOS circuitry. As shown in a copending applicaton Ser. No. 956,953 filed Nov. 2, 1978, and now abandoned, by Thomas M. Frederiksen, Joseph J. Connolly, Jr, and Thomas P. Redfern, the basic CMOS structure readily admits of incorporating substrate collector connector bipolar transistors. It is further shown how bipolar lateral transistors can be incorporated to yield improved performance circuits.

FIG. 1 shows in parts A and B, well-known prior art digital and linear circuits. A basic inverter gate is shown in FIG. 1A which can be incorporated into digital CMOS devices. The circuit shown is intended for driving light emitting diode (LED) display devices which require a substantial current source capability. To provide the required current using only CMOS inverters would require the use of very large transistors. In this circuit logic signals applied to terminal 10 produce the required current drive at terminal 11. $V_{CC}$ is applied at terminal 12 referenced to ground at terminal 13. P channel transistor 5 in combination with N channel transistor 6 forms a conventional CMOS inverter the output of which is coupled to the base of transistor 8. The bipolar transistor 8 has its collector dedicated to $V_{CC}$ which is actually the CMOS substrate that contains all of the IC components. The emitter constitutes the output terminal so that an emitter follower configuration is employed. N channel transistor 7 acts as the output load element which can be of small size because output sourcing requirements are small.

When terminal 10 is low, transistors 6 and 7 are off. Transistor 5 will source current into the base of transistor 8. The current sourced at terminal 11 will be the Beta of transistor 8 times the current sourced by transistor 5. Since this Beta value can be large, transistor 5 can be made quite small.

When terminal 10 is high, transistor 5 is off while transistors 6 and 7 are on. This pulls the base and emitter of transistor 8 close to ground and turns it off. As a practical matter the only current sink requirement in transistor 7 is the collector to emitter leakage in transistor 8. This is normally very low.

In FIG. 1B, a linear configuration is illustrated. P channel transistor 9 and N channel transistor 14 form an inverter that drives the base of emitter follower transistor 15. Resistor 16 forms the emitter load and resistor 18 forms a negative feedback path from output 11 back to the gates of transistors 9 and 14. Resistor 17 couples the input gates to input terminal 10. When a voltage source is coupled to terminal 10, resistors 18 and 17 form a voltage divider that controls the feedback and hence the circuit voltage gain. With an open input or a current source driver, the circuit gain is unity. The main problem associated with this linear inverting amplifier circuit is that the gain is determined by the driver circuitry and the bias is not controlled.

DESCRIPTION OF THE INVENTION

FIG. 2 shows the basic circuit of the invention. P channel transistor 20 and N channel transistor 21 form a conventional CMOS inverter that is coupled to drive the base of bipolar transistor 22. N channel transistor 23 acts as the load for transistor 22 and its gate is supplied a bias potential that results in class A amplifier operation.

Since the threshold voltage of CMOS transistors is a variable that is determined by the manufacturing process, the bias voltage needed for class A operation is not a predeterminable constant. In FIG. 2 the circuit inside dashed outline 26 is a means for developing the required bias regardless of manufacturing process variables.

Transistors 30 and 31 make up a CMOS inverter that couples to the base of transistor 32. These parts are connected similarly to transistors 20, 21, and 22 respectively. However, the inverter input is directly connected to the emitter of transistor 32. Thus, the amplifier output is connected to its input and this will force the circuit to its trip point. Since the trip point turns out to be at the center of the linear transfer characteristic for the circuit, this forces class A operation. Resistor 33 is coupled between the emitter of transistor 32 and ground, thus serving as an emitter load. Current flowing in resistor 33 will develop a potential at node 34 which will act to turn transistor 23 on and will be established as a function of the voltage required to turn transistor 31 on. Thus the bias potential will automatically track any transistor threshold voltage variations that occur in manufacturing.

Transistors 20 and 21 are designed to provide high gain operation and to conduct an operating current that is large with respect to the base current of transistor 22.

Transistor 23 is ratioed to be much larger than transistor 21 to conduct an emitter current for transistor 22 that is large relative to the current flowing in transistors 20 and 21. Desirably transistor 23 is operated well into saturation so that transistor 22 has close to unity voltage gain.

As a practical matter bias source 26 can operate at a substantially lower current than the class A amplifier stage being biased. The current is actually set by the value of resistor 33. This also means that transistors 30 and 31 can be made smaller than their counterparts 20 and 21 in the amplifier. Additionally, since node 34 is a low impedance point due to the low output impedance of transistor 32, the bias source can be employed to operate several class A amplifiers simultaneously without interaction between amplifiers.

CMOS inverters alone are useful as amplifiers and the devices can be configured to provide very useful gain values. However, I have discovered that the gain-bandwidth product of such devices has a fundamental limit. This limit appears to be due to the gate to drain capacitance of the transistors employed. It can be seen that the gate to drain capacitances of both transistors are in parallel and connected between the input and output terminals. To display gain, the capacitance must charge and discharge to accommodate the signal gain. This, in effect, constitutes a Miller capacitance well recognized in conventional inverting amplifier design. In ordinary amplifiers the gain-bandwidth product is improved by increasing the operating current. Thus the Miller capacitance can be more rapidly charged. Unfortunately in a CMOS inverter an increase in current means a wider transistor and the Miller capacitance increases in proportion to the current capability so that the gain-bandwidth product remains essentially constant.

In the circuit of FIG. 2 transistors 20 and 21 can be made quite small so that the Miller capacitance is low. Transistor 22 provides a large current gain to the next stage and therefore makes the circuit appear to have large transistors with the capacitance of small transistors. The circuit of FIG. 2 typically has about five times the gain-bandwidth product of a CMOS inverter employing transistors having the same output current capability. This gives the circuit five times the speed of a simple CMOS inverter.

FIG. 3 shows the class A amplifier of the invention in an a-c coupled, chopper stabilized, d-c amplifier. The overall circuit is a d-c comparator employing the well-known charge balancing principle. Using the amplifier configuration of the invention in this application greatly speeds the comparator operation.

Bias source 26 is the same as was disclosed in FIG. 2. The amplifiers shown inside dashed outlines 19' and 19" are both operated from source 26 and each represents the class A amplifier of FIG. 2. Capacitors 42 and 43 a-c couple the two stages. Their values are selected to be larger than the stray capacitances to ground represented by the amplifier inputs.

Amplifiers 19' and 19" have N channel transistors 44 and 45 respectively coupled between input and output terminals. These transistors are provided with clock signals from terminal 46. A pair of N channel transistors 47 and 48 couple node 49 to inverting input terminal 50 and noninverting input terminal 51 respectively. Transistor 47 is supplied with a clock signal while transistor 48 is supplied with a complementary clock signal via inverter 53. Transistors 44, 45, 47, and 48 therefore are clocked switches.

Assuming that clock terminal 46 is momentarily high and that terminal 50 is at a reference potential ($V_{REF}$), it can be seen that transistors 44, 45, and 46 are on and transistor 48 is off. Both amplifiers 19' and 19" will have their outputs connected to their inputs and will be at their trip points. Capacitor 42 will quickly charge to the difference between $V_{REF}$ and the trip point of amplifier 19'. Capacitor 43 will quickly charge to the trip point difference between amplifiers 19' and 19".

On the next half of the clock cycle, terminal 46 goes low, thus turning off transistors 44, 45, and 47 and turning on transistor 48. Now if terminal 51 is exactly at $V_{REF}$, the output terminal at 52 will remain at the trip point of amplifier 19". If terminal 51 is more positive than $V_{REF}$, terminal 52 will go high. If terminal 51 is below $V_{REF}$, terminal 52 will go low. It can be seen that as a practical matter terminal 51 will simply be referenced to terminal 50 and the circuit behaves as a simple d-c comparator.

For the configuration shown, assuming an amplifier gain of $10^3$ (for two amplifiers as shown), a one millivolt differential input will produce a one volt output. Thus, using a 5 volt $V_{CC}$ supply, a ±2.5 millivolt input will drive the output rail-to-rail for digital comparator response.

Clearly the comparator sensitivity can be made greater by adding more a-c coupled, chopper stabilized, amplifier sections. Alternatively a latching sense amplifier can be connected to terminal 52.

The circuit of FIG. 3 fully compensates the devices for offset and drift. The clock can be operated at a relatively high frequency. Its period is made long enough for the coupling capacitors to attain a suitable charge stability in the charge balancing action.

FIG. 4 shows one form of IC construction that can be employed to create amplifier 19 of FIG. 2. This drawing shows a fragment of a circuit chip partly in cross section and partly in front elevation to indicate topography. The section can be regarded as through the center of the structure so that the topography represents half of a symmetrical design. The drawing is not to scale. The dimensions have been exaggerated to illustrate the concepts. In practice conventional CMOS construction, as is well-known in the art, will be employed. For clarity the oxide layers and metallization have been removed. The metal connections are shown in schematic form to illustrate the circuit.

The substrate 60 is a wafer of lightly doped or N− type silicon. An N+ diffusion 61 creates an ohmic substrate connection and is used as a guard ring which is extended to surround each of the active devices 20–23. Transistor 20 includes a source 62 connected to +$V_{CC}$, a gate 63 connected to input terminal 24, and a drain 64 connected to transistors 21 and 22 as shown. Transistor 21 includes a source 65 connected to ground and an associated P− well 66 via ohmic P+ contact ring 67, a gate 69 connected to terminal 24, and a drain 70 connected to the drain of transistor 20. Transistor 22 includes a P− base 71 connected via ohmic P+ ring 72 to the drain of transistor 21, and an N+ emitter 73 which constitutes the amplifier output terminal 25. The collector of transistor 22 is not a separate element but constitutes that portion of the substrate 60 that faces the base electrode 71. Transistor 23 includes an N+ source 74 connected to P+ ring 75 which provides ohmic connection to P− well 76 (both of which are grounded), a gate 77 which is connected to bias node 34, and an N+ drain 78 which is connected to the emitter 73 of transistor 22.

EXAMPLE

The circuit of FIG. 2 was constructed in conventional CMOS form using the device sizes shown in the following table. The sizes indicated are the W/L channel dimensions expressed in mils.

| DEVICE | SIZE | DEVICE | SIZE |
| --- | --- | --- | --- |
| 20 | 0.9/6.8 | 30 | 0.3/0.5 |
| 21 | 0.6/0.4 | 31 | 0.85/0.3 |
| 23 | 8.5/0.3 | Resistor 33 | 6.2 Kohms |

The circuit was operated at 5 volts $V_{CC}$. The typical value of bias at node 34 was about 1.2 volts. The trip point for amplifier 19 was typically about 1.7 volts and the base of transistor 22 was typically about 2.4 volts. The current flowing in the emitter of transistor 22 was about 250 microamperes and the current flowing in transistors 20 and 21 was about 32 microamperes. The base current in transistor 22 was about 5 microamperes, thus indicating a circuit Beta of about 50. These operating values clearly indicate class A bias conditions. The amplifier gain was about 30 and displayed a gain bandwidth product of over 5 times that of a CMOS inverter operating at the same current as transistor 22.

FIG. 5 shows the amplifier of the invention used in a latch configuration. Input terminal 80 is coupled via transmission gate 81, which includes transistors 82 and 83, to the gates of transistors 84 and 85 which form an inverter. The common drain connection of transistors 84 and 85 drives the base of emitter follower transistor 86. N channel transistor 87 acts as the emitter follower load and its base is coupled to a bias supply, such as bias supply 26 of FIG. 2 or 3, for class A amplifier operation. The emitter of transistor 86 drives the gates of transistors 88 and 89 which operate as a second inverter, the output of which drives output terminal 90. Both inverters, involving transistors 84, 85, 88, and 89, employ small area devices. The two inverters are isolated by emitter follower transistor 86 so that very high speed operation is possible. The gain from terminal 80 (assuming that transmission gate 81 is on) to terminal 90 can easily be as high as $2.5 \times 10^3$. This means that ± one millivolt signal at terminal 80 will drive terminal 90 rail to rail in a 5 volt $V_{CC}$ system.

A second transmission gate 91, composed of transistors 92 and 93, is coupled from output terminal 90 to the gates of transistors 84 and 85. The transmission gates are switched from terminal 94 with inverter 95 providing the required switching signal complement. When terminal 94 is high, gate 81 will be off and gate 91 will be on. In this state the output at terminal 90 is coupled back to the gates of transistors 84 and 85 so that the circuit will latch. Thus, when gate 91 is turned on, the circuit will regenerate. If the input was slightly above the amplifier trip point, the output will rapidly switch to the $+V_{CC}$ rail. If the input was slightly below the trip point, the output will rapidly switch to the ground rail. In effect the latch state converts the amplifier into a highly sensitive sense amplifier that has two stable output states.

When terminal 94 is low, gate 81 will be on and gate 91 will be off. The input at terminal 80 will be coupled into the first inverter and the output will follow the input at least until limiting is encountered. This is the sense state of the latch. The latch will then assume a state determined by the input potential at the instant when the signal on terminal 94 goes from low to high or from sense to latch.

In a practical system, the clocked comparator of FIG. 3 will have its output terminal 52 coupled to terminal 80 of FIG. 5 and terminal 90 of FIG. 5 then becomes the comparator output. Such a combination can have an input sensitivity on the order of microvolts.

The invention has been described and specific applications taught. A useful structure has been disclosed and an example given showing the performance of an actual circuit. When a person skilled in the art reads the foregoing disclosure there are alternatives and equivalents that will occur to him within the spirit and intent of the invention. Accordingly, it is intended that the scope of the invention be limited by the claims that follow.

I claim:

1. An inverting amplifier suitable for fabrication using complementary metal oxide semiconductor technology, said amplifier comprising:

a first complementary pair of transistors having their drain electrodes coupled together and source-drain elements coupled in series between positive and negative power supply rails connectible to a source of operating voltage, the gate electrodes of first said pair being coupled together to constitute the input terminal for said amplifier;

a first bipolar junction transistor having a collector coupled to said positive power supply rail, a base coupled to the juncture of said drain electrodes of said first complementary pair, and an emitter which constitutes the output terminal of said amplifier;

an N channel transistor having its source drain electrodes coupled between said emitter of said first bipolar junction transistor and said negative power supply rail and a gate electrode; and means for coupling a source of bias voltage to said gate of said N channel transistor whereby said stage is biased into class A operation.

2. The amplifier of claim 1 wherein the channel width of said N channel transistor is substantially larger than the channel width of said complementary pair.

3. The amplifier of claim 2 wherein said source of bias voltage comprises:

a second complementary pair of transistors having their source-drain elements coupled in series between said power supply rails, the gate electrodes of said second pair being connected together;

a second bipolar transistor having a collector coupled to said positive power supply rail, a base coupled to said drain elements of said second complementary pair of transistors, and an emitter coupled to said gate electrodes of said second complementary pair of transistors whereby said second bipolar transistor and said second complementary pair of transistors form an amplifier forced to its trip point; and load means coupled between said emitter of said second bipolar transistor and said negative supply rail whereby said bias potential appears across said load means.

4. The amplifier of claim 3 in which said second pair of complementary transistors are ratioed so that said bias voltage is higher than the trip point of said amplifier.

5. The amplifier of claim 3 in combination with means for periodically coupling said output of said amplifier to said input of said amplifier;

a pair of switches connected to alternately couple a pair of input terminals to a common point, said switches being operated in synchronism with said means for periodic coupling; and capacitive means for coupling said common point to said amplifier input whereby said output is responsive to the dc differential potential that exists between said pair of input terminals.

6. The amplifier of claim 3 in combination with a third complementary pair of transistors having their source drain elements coupled in series between said rails, the gate electrodes of said third pair being coupled together to the emitter of said bipolar transistor thereby to create a voltage follower having an input at said gate electrodes of said first pair and an output at the commonly connected drain electrodes of said second pair; and means for periodically coupling said voltage follower input to its output to create a clock latch.

7. The latch of claim 6 wherein said last named means comprise a first transmission gate operated from complementary control signals.

8. The latch of claim 7 in further combination with means for periodically isolating said input of said voltage follower.

9. The latch of claim 8 wherein said means for isolating comprise a second transmission gate supplied with complementary control signals so that said second gate is on when said first gate is off and said second gate is off when said first gate is on.

* * * * *